(12) United States Patent
Tseng

(10) Patent No.: US 7,692,496 B2
(45) Date of Patent: Apr. 6, 2010

(54) METHOD AND APPARATUS FOR GENERATING OUTPUT SIGNAL

(75) Inventor: Chien-Chung Tseng, Hsin-Chu (TW)

(73) Assignee: Realtek Semiconductor Corp., HsinChu (TW)

(*) Notice: Subject to any disclaimer, the term of this patent is extended or adjusted under 35 U.S.C. 154(b) by 170 days.

(21) Appl. No.: 11/691,492

(22) Filed: Mar. 26, 2007

(65) Prior Publication Data
US 2007/0241824 A1    Oct. 18, 2007

(30) Foreign Application Priority Data
Mar. 30, 2006   (TW) .............................. 95111291 A

(51) Int. Cl.
H03L 7/07        (2006.01)
H03L 7/087       (2006.01)

(52) U.S. Cl. ......................... 331/11; 327/157
(58) Field of Classification Search ............... 331/10, 331/11; 327/157
See application file for complete search history.

(56) References Cited

U.S. PATENT DOCUMENTS

| 5,942,949 | A  | * | 8/1999  | Wilson et al. ............... 331/17 |
| 6,853,223 | B2 | * | 2/2005  | Ebuchi et al. .............. 327/156 |
| 7,310,021 | B2 | * | 12/2007 | Familia ...................... 331/17 |
| 7,418,071 | B2 | * | 8/2008  | Harrison ................... 375/374 |

| 2001/0015677 | A1 | 8/2001  | Choi   |
| 2004/0232998 | A1 | 11/2004 | Yamane |

FOREIGN PATENT DOCUMENTS

| EP | 1 020 994 A1      | 7/2000 |
| WO | WO 2005/022752 A1 | 3/2005 |

OTHER PUBLICATIONS

Larsson, A 2-1600-MHz CMOS Clock Recovery PLL with Low-Vdd Capability, IEEE Journal of Solid-State Circuits vol. 34, No. 12, Dec. 1999, p. 1951-1960.
Jeong, Design of PLL-Based Clock Generation Circuits, IEEE Journal of Solid-State Circuits. vol. SC-22, No. 2, Apr. 1987, p. 255-261.
Park, A Low-Noise, 900-MHz VCO in 0.6um CMOS, IEEE Journal of Solid-State Circuits. vol. 34, No. 5, May 1999, p. 586-591.
Dunning, An All-Digital Phase-Locked Loop with 50-Cycle Lock time Suitable for High-Performance Microprocessors, IEEE Journal of Solid-State Circuits. vol. 30, No. 4, Apr. 1995, p. 412-422.
Razavi, Design of Analog CMOS Integrated Circuits.(Chapter 15), Processor of Electrical Engineering University of California, Los Angeles, p. 532-578.

* cited by examiner

Primary Examiner—Robert Pascal
Assistant Examiner—James E Goodley
(74) Attorney, Agent, or Firm—Winston Hsu

(57) ABSTRACT

The oscillating signal generator utilizes a rising edge phase difference and a falling edge phase difference of the input signal and a feedback signal to generate a rising control signal and a falling control signal, and generates an output signal according to the rising control signal and the falling control signal; wherein the feedback signal corresponds to the output signal.

15 Claims, 7 Drawing Sheets

METHOD AND APPARATUS FOR GENERATING OUTPUT SIGNAL

BACKGROUND OF THE INVENTION

1. Field of the Invention

The present invention is related to an electronic circuit, and more particularly, to a signal generating apparatus.

2. Description of the Prior Art

A signal generator is capable of performing many functions. For example, the signal generator can perform a data/clock recovering process, modulating and demodulating frequency and phase, and generating a stable clock that can be synthesized into another frequency.

There are some tradeoffs that should be considered when designing a low jitter fast phase locking synthesizer. Specifically, when lowering the jitter and when increasing the tracking and locking of the phase it is well known that these two aspects of the signal generator are intrinsically in contradiction with each other. Furthermore, holding the operating duty-cycle of the clock signal at 50% is another critical issue in designing the synthesizer. In the prior art, a voltage controlled oscillator (VCO) is operated at doubled oscillating frequency (i.e., double the required frequency of the system), and then the oscillating frequency is divided in half in order to obtain the required oscillating frequency and the required 50% operating duty-cycle. However, when the requirement of oscillating frequency of the system clock is getting higher, the VCO is hard to oscillate at the doubled oscillating frequency.

SUMMARY OF THE INVENTION

One objective of the present invention to provide a signal generating apparatus and method thereof which utilize a rising edge phase difference and a falling edge phase difference to proceed a phase locking operating.

Another objective of the present invention is providing a signal generating apparatus with fast phase locked.

Another objective of the present invention is providing a signal generating apparatus with an adjustable bandwidth control.

Another objective of the present invention is providing a signal generating apparatus with a duty-cycle correction.

Another objective of the present invention is providing a signal generating apparatus with a low jitter and method thereof.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
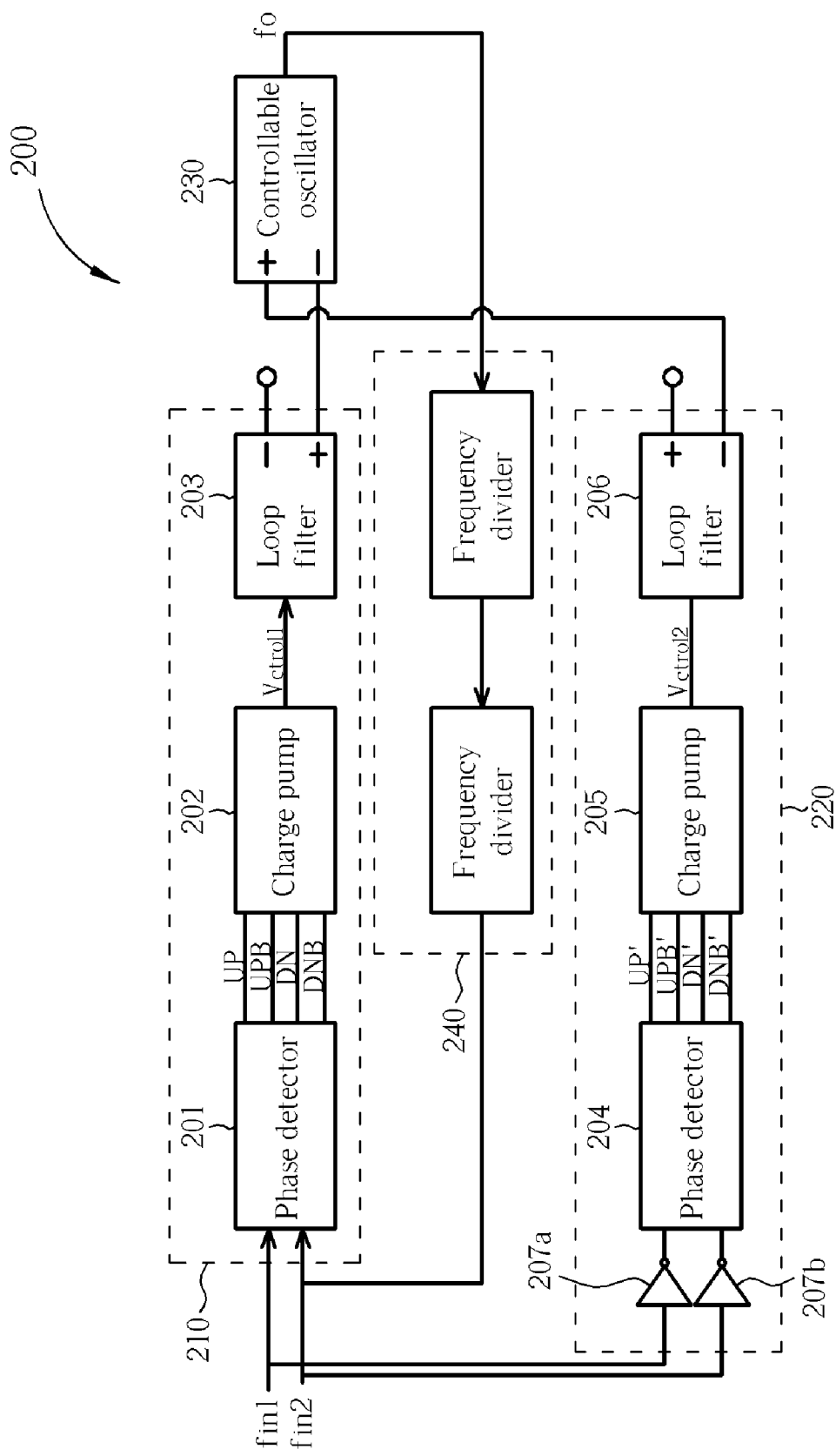
FIG. 1 illustrates a signal generator according to an embodiment of the present invention.
Figure 7:
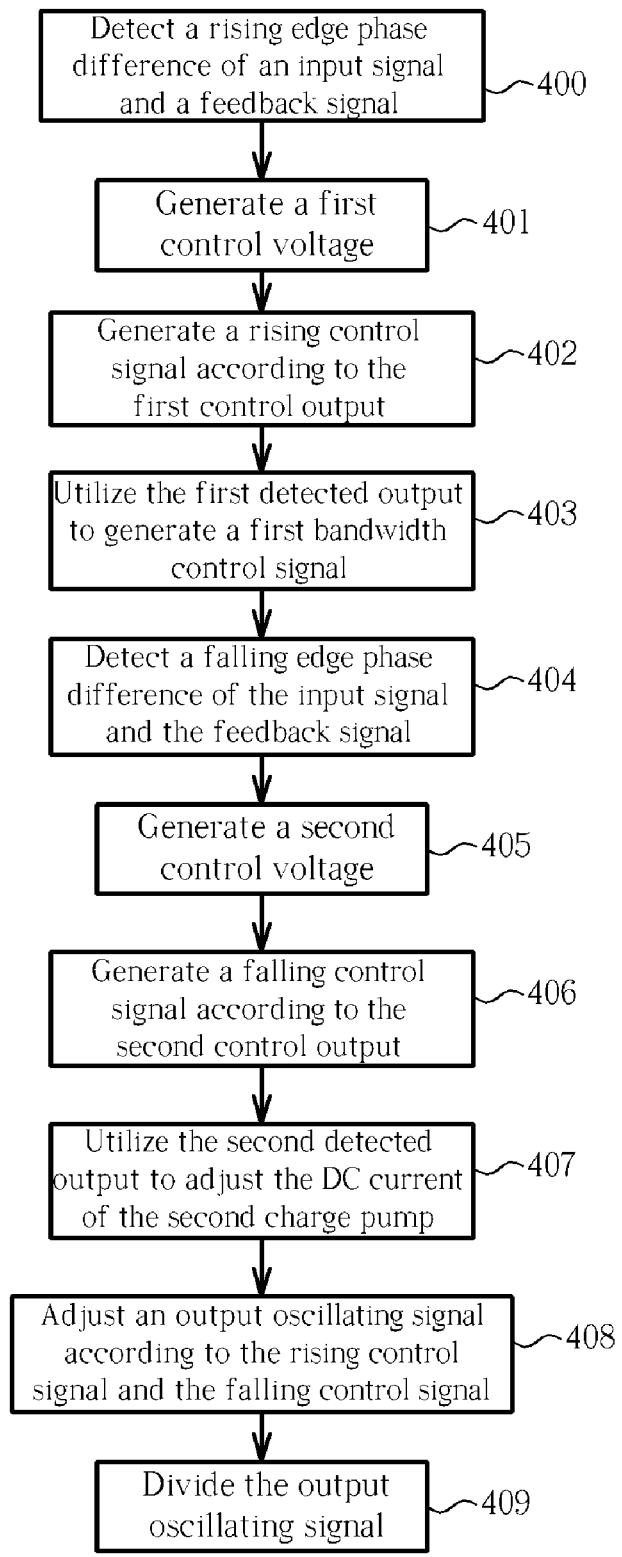
FIG. 7 illustrates a phase locking method according to an embodiment of the present invention.

Please refer to FIG. 1 and FIG. 7. FIG. 1 illustrates a signal generating apparatus 200 according to an embodiment of the present invention. FIG. 7 illustrates a flowchart of a phase locking method according to an embodiment of the present invention. The signal generating apparatus 200 comprises: a first detecting circuit 210, a second detecting circuit 220, a controllable oscillator 230, and a feedback frequency divider 240, and the connecting relationship is shown as FIG. 1. The first detecting circuit 210 is for detecting a rising edge phase difference of an input signal fin1 and a feedback signal fin2 to generate a rising control signal. The second detecting circuit 220 is for detecting a falling edge phase difference of the input signal fin1 and the feedback signal fin2 to generate a falling control signal. In an embodiment, the first detecting circuit 210 comprises: a first phase detector 201, a charge pump 202, and a loop filter 203. The detail descriptions of the first phase detector 201, charge pump 202, feedback frequency divider 240, and loop filter 203 are omitted here since they are prior art circuits. In the embodiment, the configuration of the second detecting circuit 220 is substantially equal to the first detecting circuit 210, the second detecting circuit 220 further comprises inverters 207a, 207b that located at the front of a second phase detector 204, wherein the inverters 207a, 207b are used for inverting the input signal fin1 and the feedback signal fin2. An output oscillating signal fo of the controllable oscillator 230 is coupled to the feedback frequency divider 240, and the feedback signal fin2 of the feedback frequency divider 240 is transmitted to the first phase detector 201 and the second phase detector 204.

Figure 2:
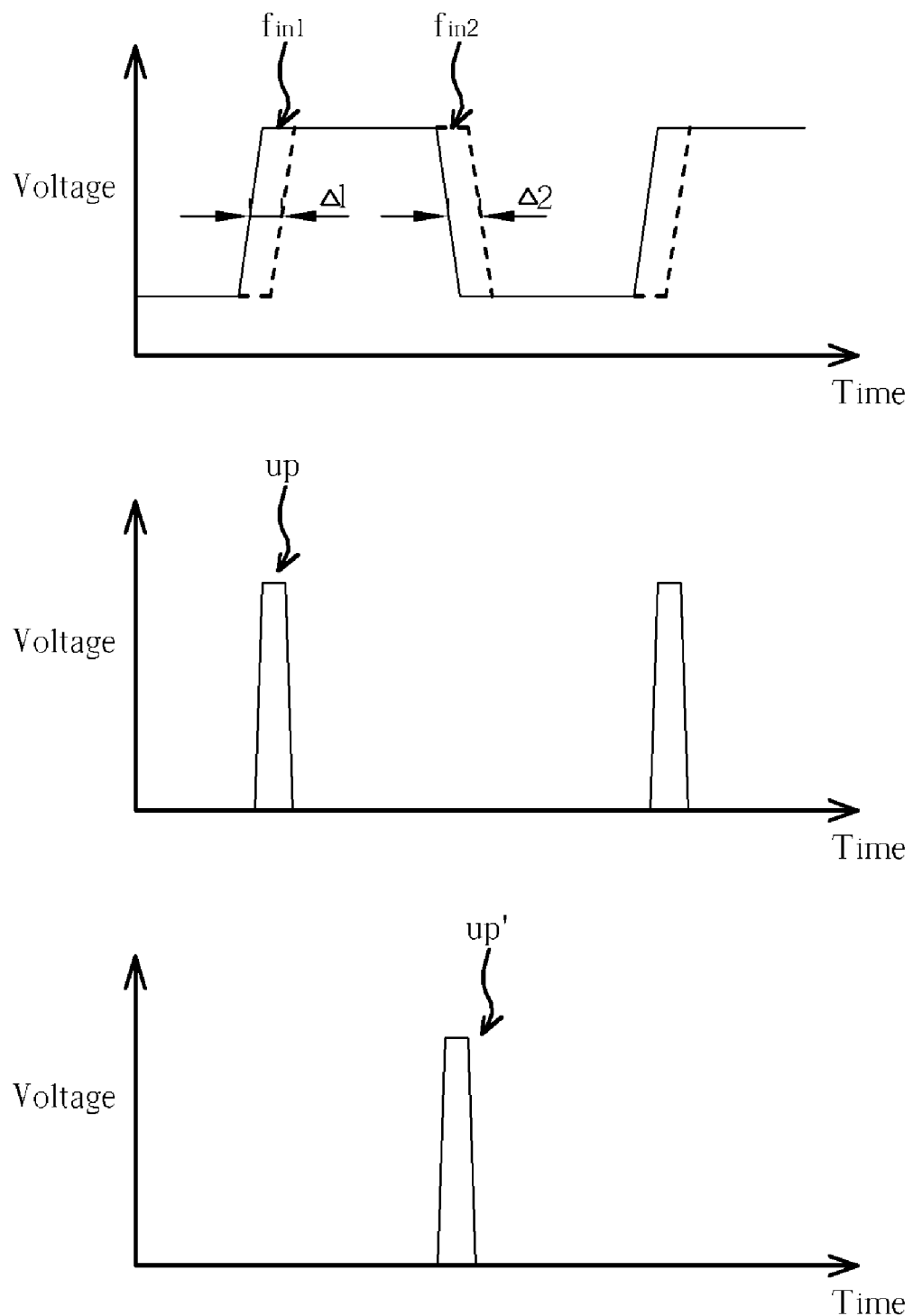
FIG. 2 illustrates a waveform diagram of the input signal, feedback signal, and detected signals according to the signal generator in FIG. 1.

FIG. 2 illustrates a waveform diagram of the input signal fin1, feedback signal fin2, and detected signals UP, UP' according to the signal generating apparatus 200 in FIG. 1. The first phase detector 201 compares the rising edge phase difference Δ1 of the input signal fin1 and the feedback signal fin2 to generate two set of detected signals (UP, UPB), (DN, DNB), in which the two set of detected signals (UP, UPB), (DN, DNB) are outputted from four output terminals, respectively; wherein the phase of the detected signals (UP, UPB) are inversed to each other, and the phase of the detected signals (DN, DNB) are inversed to each other. When the phase of the input signal fin1 is ahead the phase of the feedback signal fin2, the detected signal UP is a high voltage level; otherwise, the detected signal DN is a high voltage level. Simultaneously, the second phase detector 204 compares the rising edge phase difference of the two input terminals, which is equal to the falling edge phase difference Δ2 of the input signal fin1 and the feedback signal fin2, and generates two set of detected signals (UP', UPB'), (DN', DNB') from four output terminals, respectively.

According to FIG. 2, a control signal is inputted to the controllable oscillator 230 in every half cycle, therefore the phase locking of the signal generating apparatus 200 of the present invention is faster than the prior art that a control signal is inputted to the controllable oscillator in every cycle. On the other hand, because the control signal is inputted to the controllable oscillator 230 in every half cycle, therefore the operating duty-cycle of the output oscillating frequency fo that generated by the controllable oscillator 230 is 50%.

Figure 3:
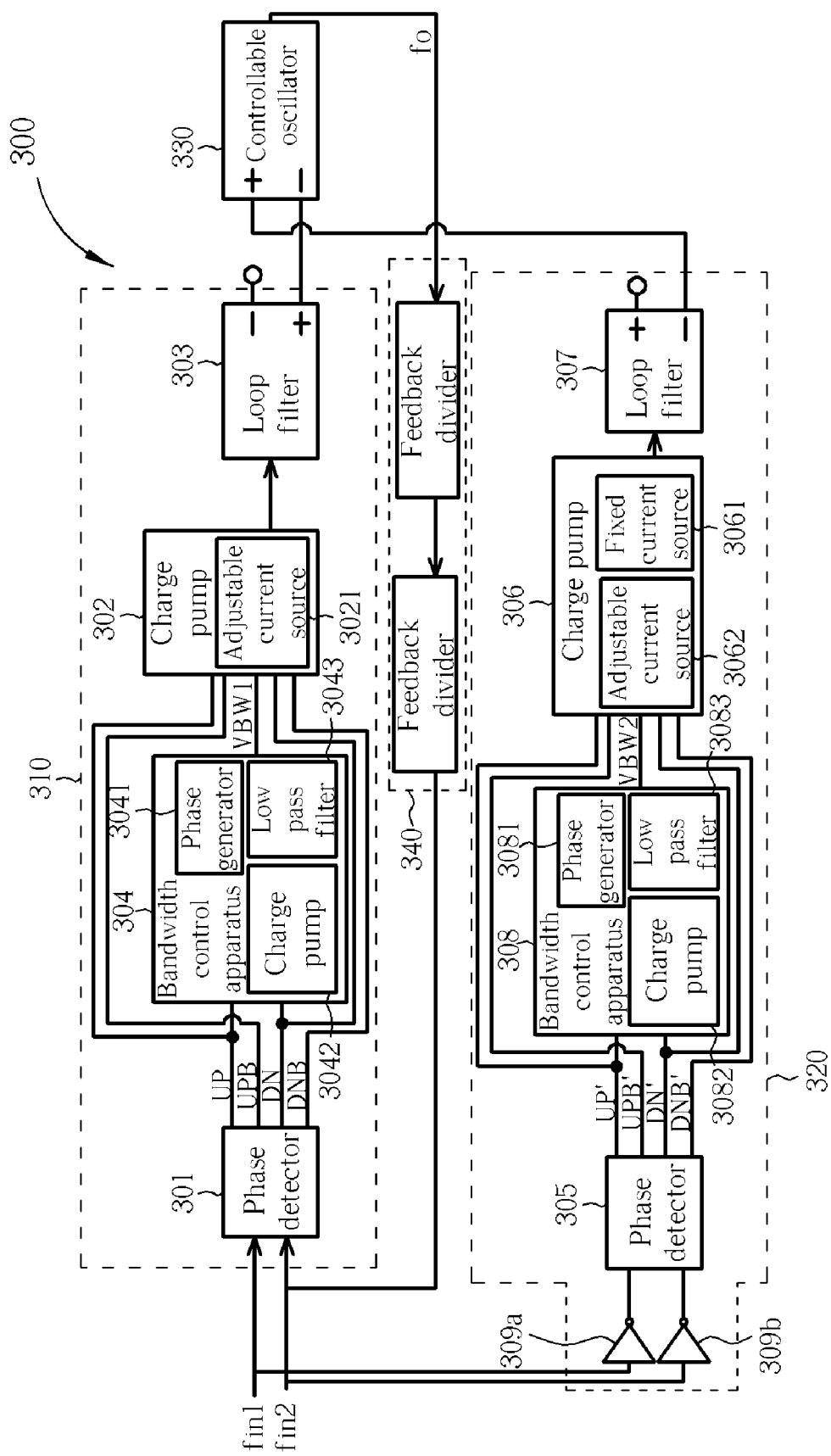
FIG. 3 illustrates a signal generator according to a second embodiment of the present invention.

FIG. 3 illustrates a functional block of a signal generating apparatus 300 according to a second embodiment of the present invention. The detecting circuit 310 comprises a first bandwidth control apparatus 304, coupled between a phase detector 301 and a charge pump 302. In an embodiment, the first bandwidth control apparatus 304 comprises a phase generator 3041, a charge pump 3042, and a low pass filter 3043. Furthermore, in the second embodiment, the first charge pump 302 comprises an adjustable current source 3021. The second detecting circuit 320 further comprises a second bandwidth control apparatus 308 that substantially equals to the first bandwidth control apparatus 304. Moreover, in the second embodiment, the second charge pump 306 comprises a fixed current source 3061 and an adjustable current source 3062.

Firstly, the frequency of the input signal fin1 is significantly different from the final locking frequency in the beginning operation of the signal generating apparatus 300; in the other words, the phase difference of the input signal fin1 and the feedback signal fin2 is large. According to the present invention, in order to execute a fast locking of the phase, the first bandwidth control apparatus 304 will first detect the detected signals UP, DN that are generated from the phase detector 301, which represents the next or the previous phase difference of the input signal fin1 and feedback signal fin2. In this embodiment, the phase of the first input signal fin1 is assumed to be the next phase of the feedback signal fin2 for the sake of brevity and clarify in the examples provided. Accordingly, the detected signal UP is high voltage level. The phase generator 3041 outputs an input signal $\Delta\theta1$ to the charge pump 3042 according to the detected signal UP, and the input signal $\Delta\theta1$ is proportional to the detected signal UP (the phase difference of input signal fin1 and feedback signal fin2); therefore the detected signal UP is also proportional to the control voltage VBW1. Accordingly, the control voltage VBW1 is able to adjust the current source of the first charge pump 302, that is adjust the current of the adjustable current source 3021. As is well known to those have average skill in the related art, the current source of the first charge pump 302 will decide the loop gain of the loop that formed by the first detecting circuit 310 and the feedback frequency divider 340. In other words, when the input signal $\Delta\theta1$ is larger (i.e., the initial state of phase locking), the loop gain of the loop that formed by the first detecting circuit 310 and the feedback frequency divider 340 is higher; and when the input signal $\Delta\theta1$ is smaller (i.e., final state of phase locking), the loop gain of the loop that formed by the first detecting circuit 310 and the feedback frequency divider 340 is lower. Accordingly, the jitter of the output oscillating signal fo can be reduced. Simultaneously, when the input signal $\Delta\theta1$ is larger (i.e., the initial state of phase locking) or smaller (i.e., final state of phase locking), the operation of the loop that formed by the second detecting circuit 320 and the feedback frequency divider 340 is also alike to the above-mentioned operation.

In an embodiment, the second charge pump 306 further comprises a fixed current source. When the input signal $\Delta\theta1$ is getting smaller (i.e., stable state of phase locking), the DC current of the first charge pump 302 is zero since the first charge pump 302 does not consist of the fixed current source. Therefore, in the stable state of the phase locking operation, the loop that formed by the first detecting circuit 310 and the feedback frequency divider 340 is an open loop; and since the second charge pump 306 of the second detecting circuit 320 consists of the fixed current source 3061, thus the signal generating apparatus 300 of the present invention keeps locking in the low jitter situation. When the signal generating apparatus 300 operates in a stable locking state, an over correction to the controllable oscillator 330 by two control voltages that generated by the two loops can be avoided. According to the above-mentioned operation, the signal generating apparatus of the present invention is not only able to proceed at a fast phase locking operation, but also is able to reduced the jitter of the output oscillating signal fo.

Figure 4:
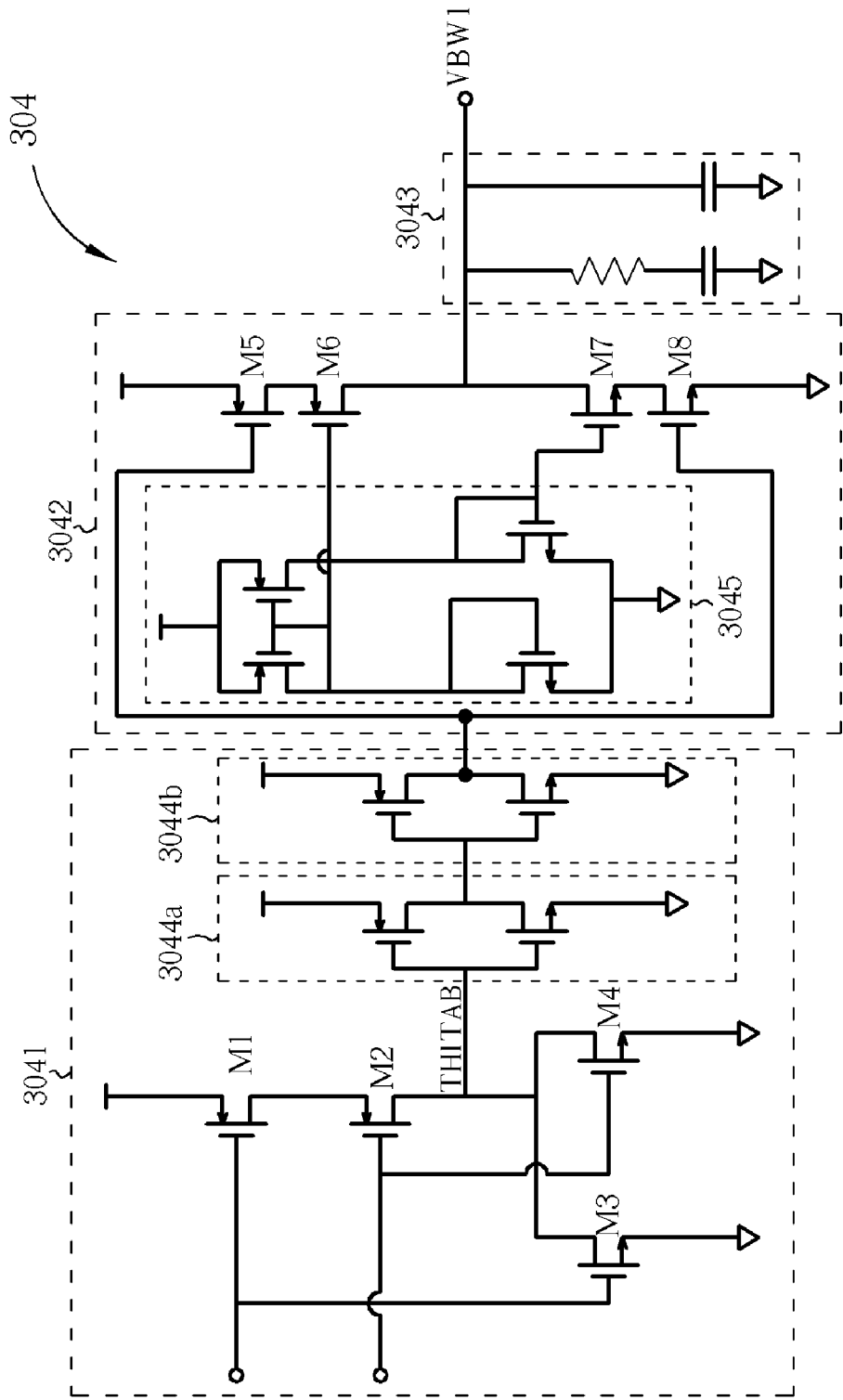
FIG. 4 illustrates an embodiment of the bandwidth control apparatus of FIG. 3.

FIG. 4 illustrates a diagram of an embodiment of the bandwidth control apparatus 304 of FIG. 3. The phase generator 3041 comprises two series connected P-type transistors M1, M2 and two parallel connected N-type transistors M3, M4, wherein the gate terminal of the transistors M1 and M3 and the gate terminal of the transistors M2 and M4 receive the detected signal UP, DN, respectively; and the phase generator 3041 further comprises two invertors 3044a, 3044b for pulling a detected output signal THITAB of the phase generator 3041 to the highest or lowest voltage level. The charge pump 3042 comprises two series connected P-type transistors M5, M6, and two series connected P-type transistors M7, M8; wherein the gate terminal of the transistors M5 and M8 are coupled to output terminal of the phase generator 3041, and the gate terminal of the transistors M6 and M7 are coupled to the two output terminals of the a biasing circuit 3045, respectively. The low pass filter 3043 is coupled to output terminal of charge pump 3082 and outputs the voltage VBW1.

Figure 5:
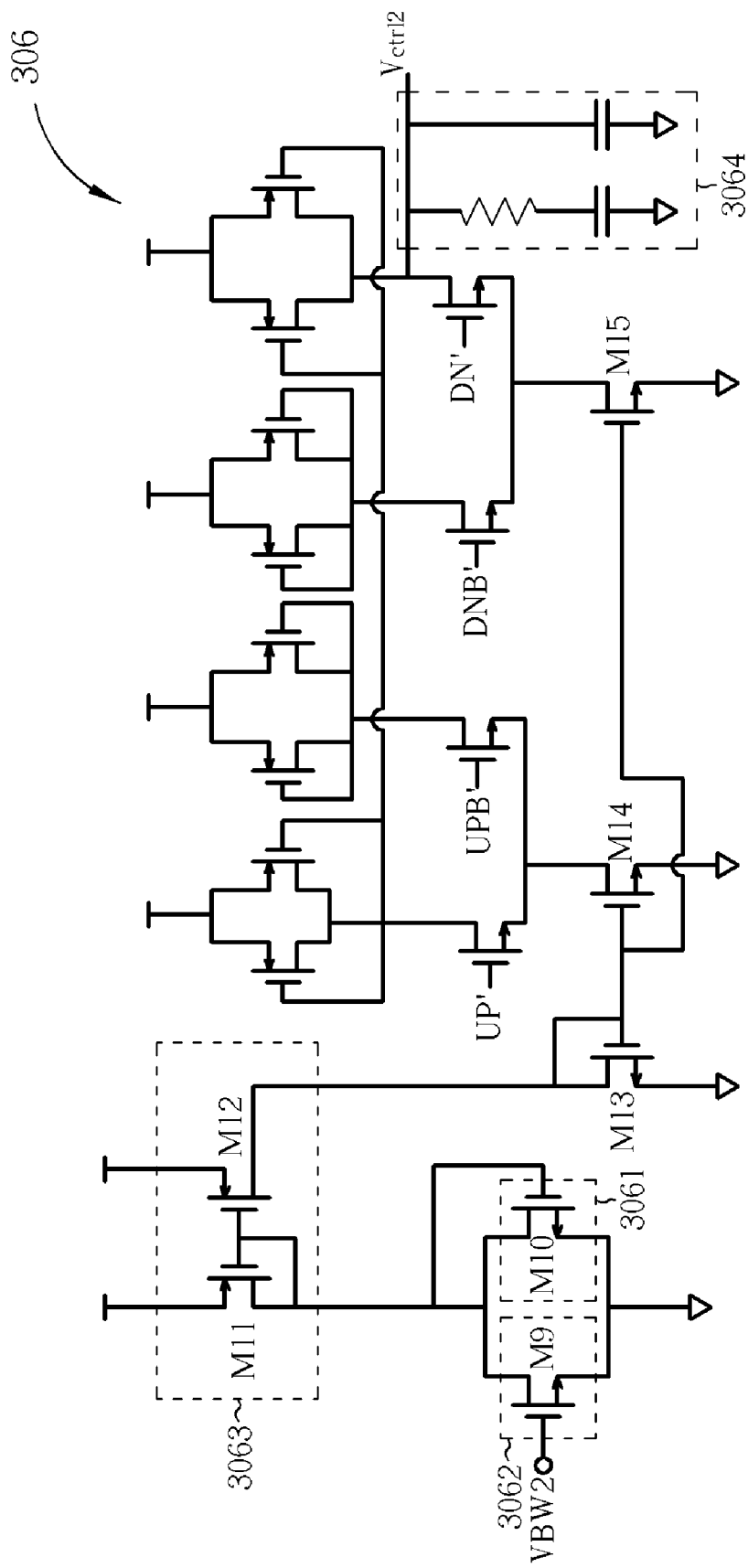
FIG. 5 illustrates an embodiment of the second charge pump of FIG. 3.

FIG. 5 illustrates a diagram of an embodiment of the second charge pump 306 of FIG. 3. The second charge pump 306 comprises the fixed current source 3061 and the adjustable current source 3062. In which, the gate terminal of the transistor M9 coupled to the voltage VBW2, and the gate terminal of the transistor M10 coupled to the drain terminal form a fixed load of the current mirror 3063 (formed by the P-type transistors M11, M12) to provide a fixed current that is required by the second charge pump 306. When the phase of the input signal fin1 is widely ahead of the phase of the feedback signal fin2, or when $\Delta\theta2$ is large, the voltage VBW3 increases the current of transistor M9 to increase the current of the current mirror 3063. When the phase of the input signal fin1 is substantially synchronize to the phase of the feedback signal fin2, or when $\Delta\theta2$ is small (i.e., state of phase locking), the voltage VBW2 is low enough to turn off the transistor M9, thus there is only the fixed current that is generated by the transistor M10 that is provided to the current mirror 3063. Furthermore, the voltage Vctrl2 that is outputted from the second charge pump 306 is filtered by a low pass filter 3064 and then transmitted to the loop filter 307.

Figure 6:
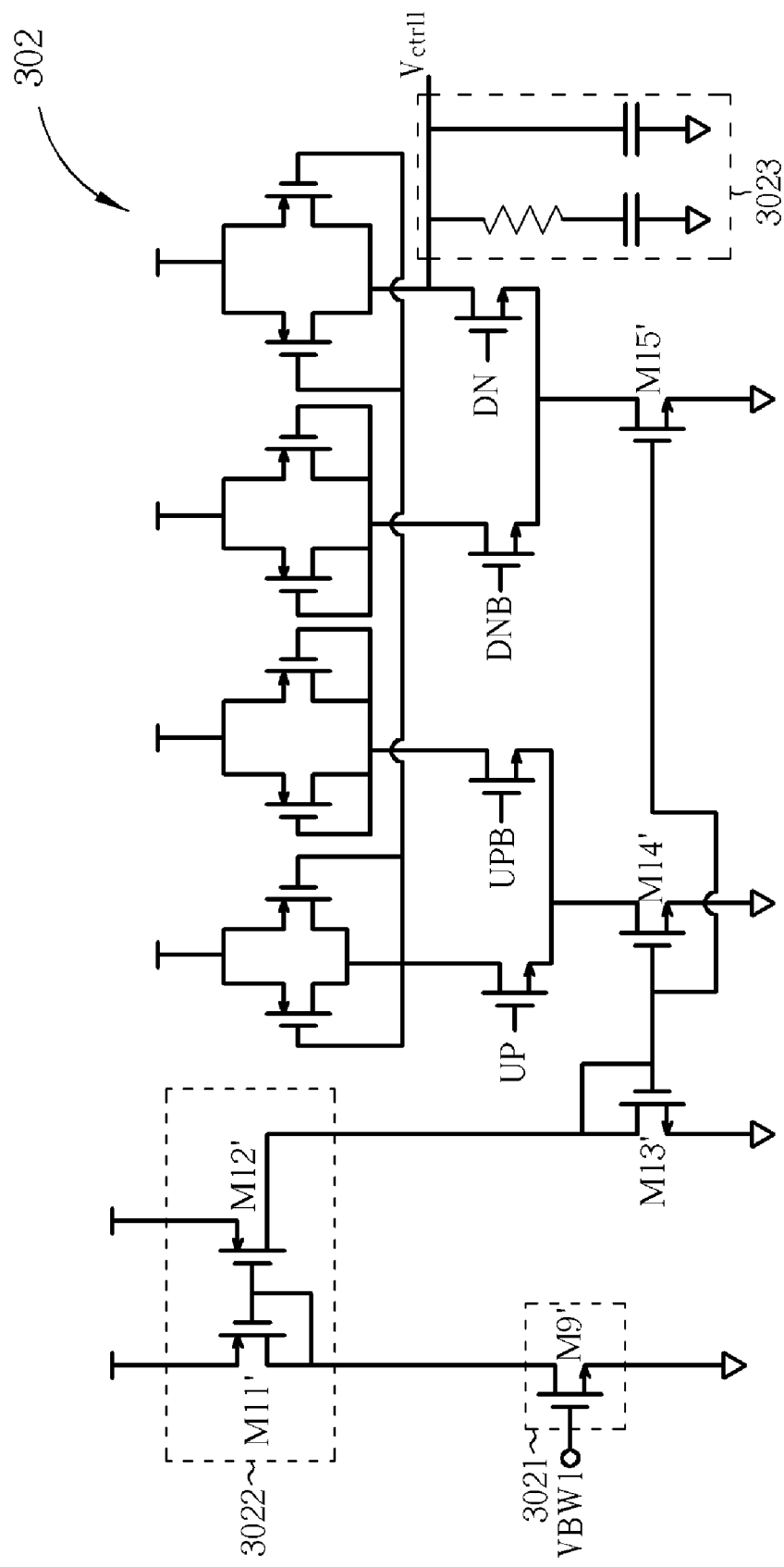
FIG. 6 illustrates an embodiment of the first charge pump of FIG. 3.

FIG. 6 illustrates a diagram of an embodiment of the first charge pump 302 of FIG. 3. In the embodiment, the first charge pump 302 does not includes the fixed current source 3061, and other devices of the first charge pump 302 are substantially alike as those of the second charge pump 306 as shown in FIG. 6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generating apparatus, comprising:
   a first detecting circuit configured to detect a rising edge phase difference of an input signal and a feedback signal to generate a first control signal, the first detecting circuit including:
      a first phase detector configured to detect the rising edge phase difference of the input signal and the feedback signal to generate a first detecting signal; and
      a first charge pump configured to generate the first control signal according to the first detecting signal;
   a second detecting circuit configured to detect a falling edge phase difference of the input signal and the feedback signal to generate a second control signal;

a controllable oscillator configured to adjust an output oscillating signal according to the first control signal and the second control signal;

a feedback circuit configured to generate the feedback signal according to the output oscillating signal; and a first bandwidth control unit configured to utilize the first detecting signal to generate a first bandwidth control signal to adjust a DC current of the first charge pump, wherein the first bandwidth control unit comprises:

a phase generator, for generating a phase signal according to the first detecting signal;

a charge pump, for generating the first bandwidth control signal according to the phase signal; and a filter, for filtering the first bandwidth control signal.

2. The apparatus of claim 1, wherein the controllable oscillator is a voltage-controlled oscillator.

3. The apparatus of claim 1, wherein the first charge pump comprises:

an adjustable current source, for generating a first current according to the first bandwidth control signal.

4. The apparatus of claim 1, wherein the second detecting circuit comprises:

a second phase detector, for detecting the falling edge phase difference of the input signal and the feedback signal to generate a second detecting signal; and a second charge pump for generating the second control signal according to the second detecting signal.

5. The apparatus of claim 4 further comprising:

a second bandwidth control unit configured to generate a second bandwidth control signal according to the second detecting signal to adjusting a DC current of the second charge pump.

6. The apparatus of claim 4, wherein the second charge pump comprises:

a fixed current source, for providing a second current; and an adjustable current source, for generating a third current according to the second bandwidth control signal, where the DC current of the second charge pump is a sum of the second, and the third current.

7. A signal generating method, comprising:

detecting a rising edge phase difference of an input signal and a feedback signal to generate a first control signal by:

detecting the rising edge phase difference of the input signal and the feedback signal to generate a first detecting signal;

utilizing a first charge pump to generate a first control voltage according to the first detecting signal; and generating the first control signal according to the first control voltage;

detecting a falling edge phase difference of the input signal and the feedback signal to generate a second control signal;

adjusting an output oscillating signal according to the first control signal and the second control signal;

generating the feedback signal according to the output oscillating signal; and generating a first bandwidth control signal according to the first detecting signal to adjust a DC current of the first charge pump by:

generating a phase signal according to the first detecting signal;

generating the first bandwidth control signal according to the phase signal; and filtering the first bandwidth control signal.

8. The method of claim 7, wherein the first charge pump comprises:

a fixed current source, for providing a first current; and an adjustable current source, for generating a second current according to the first bandwidth control signal, where the DC current of the first charge pump is a sum of the first current and the second current.

9. The method of claim 7, wherein generating the second control signal comprises:

detecting the falling edge phase difference of the input signal and the feedback signal to generate a second detecting signal;

utilizing a second charge pump to generate a second control voltage according to the second detecting signal; and generating the second control signal according to the second control voltage.

10. The method of claim 9 further comprising:

utilizing the second detecting signal to generate a second bandwidth control signal to adjust a DC current of the second charge pump.

11. The method of claim 10, wherein adjusting the DC current of the second charge pump further comprises:

generating a phase signal according to the second detecting signal;

generating the second bandwidth control signal according to the phase signal; and filtering the second bandwidth control signal.

12. The apparatus of claim 1, wherein the DC current of the first charge pump determines a loop gain formed by the first detecting circuit and the feedback circuit.

13. The apparatus of claim 12, wherein the first bandwidth control unit is further for adjusting the loop gain to be proportional to the first detecting signal.

14. The method of claim 7, wherein the DC current of the first charge pump determines a gain of the first charge pump.

15. The method of claim 14, further comprising adjusting the loop gain to be proportional to the first detecting signal.

* * * * *